(12) United States Patent
Hooper et al.

(10) Patent No.: US 8,890,308 B2
(45) Date of Patent: Nov. 18, 2014

(54) INTEGRATED CIRCUIT PACKAGE AND METHOD OF FORMING THE SAME

(75) Inventors: Stephen R. Hooper, Mesa, AZ (US); William C. Stermer, Jr., Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/441,448

(22) Filed: Apr. 6, 2012

(65) Prior Publication Data

US 2013/0264692 A1 Oct. 10, 2013

(51) Int. Cl.
*H01L 23/12* (2006.01)
*H01L 21/44* (2006.01)

(52) U.S. Cl.
USPC .......... 257/704; 257/666; 257/E23.031; 438/123; 438/125

(58) Field of Classification Search
USPC ........ 257/666, 704, E23.031; 438/123, 125
See application file for complete search history.

(56) References Cited

U.S. PATENT DOCUMENTS

| | | | | |
|---|---|---|---|---|
| 4,314,225 A | * | 2/1982 | Tominaga et al. | 338/4 |
| 4,726,233 A | * | 2/1988 | Eckardt et al. | 73/727 |
| 4,898,035 A | * | 2/1990 | Yajima et al. | 73/727 |
| 5,465,626 A | | 11/1995 | Brown et al. | |
| 5,783,748 A | * | 7/1998 | Otani | 73/493 |
| 6,255,728 B1 | * | 7/2001 | Nasiri et al. | 257/704 |
| 7,102,214 B1 | | 9/2006 | Miks et al. | |
| 7,537,964 B2 | | 5/2009 | Minervini | |
| 7,900,521 B2 | | 3/2011 | Hooper et al. | |
| 8,536,663 B1 | * | 9/2013 | Kuo et al. | 257/414 |
| 2009/0314095 A1 | * | 12/2009 | Lu | 73/727 |

* cited by examiner

*Primary Examiner* — Nitin Parekh

(57) ABSTRACT

An integrated circuit package includes an electronic sensor protected by a lid structure. The electronic sensor includes a transducer placed on a backside surface of a lead frame assembly. The lid structure is placed over the transducer and is attached to the lead frame assembly on the backside surface. The lid can define an air cavity around the transducer, such that mold compound, gel, or other protective chemical material is not placed in contact with the transducer. The transducer is therefore protected without a chemical protectant, lowering the cost of the integrated circuit package and maintaining the sensitivity and performance of the transducer.

20 Claims, 2 Drawing Sheets

INTEGRATED CIRCUIT PACKAGE AND METHOD OF FORMING THE SAME

BACKGROUND

1. Field of the Disclosure

The present disclosure relates to semiconductor devices, and more particularly to integrated circuit packages for semiconductor devices.

2. Description of the Related Art

Electronic sensors are usefully employed to sense environmental conditions in a variety of devices, such as automotive devices. For example, an electronic pressure sensor placed in an automobile tire can provide an electrical indication of ambient pressure in the tire. The pressure indications can be used to detect tire over-inflation or other dangerous conditions.

Because of their size, reliability, and cost, it is sometimes useful to implement an electronic sensor as a semiconductor device incorporated in an integrated circuit package. Because the sensor can be subject to harsh environmental conditions, such as mechanical or chemical stresses, the electronic sensor is sometimes protected by a chemical protectant, such as a gel, within the integrated circuit package.

BRIEF DESCRIPTION OF THE DRAWINGS

Embodiments are illustrated by way of example and are not limited in the accompanying figures.

Figure 1:
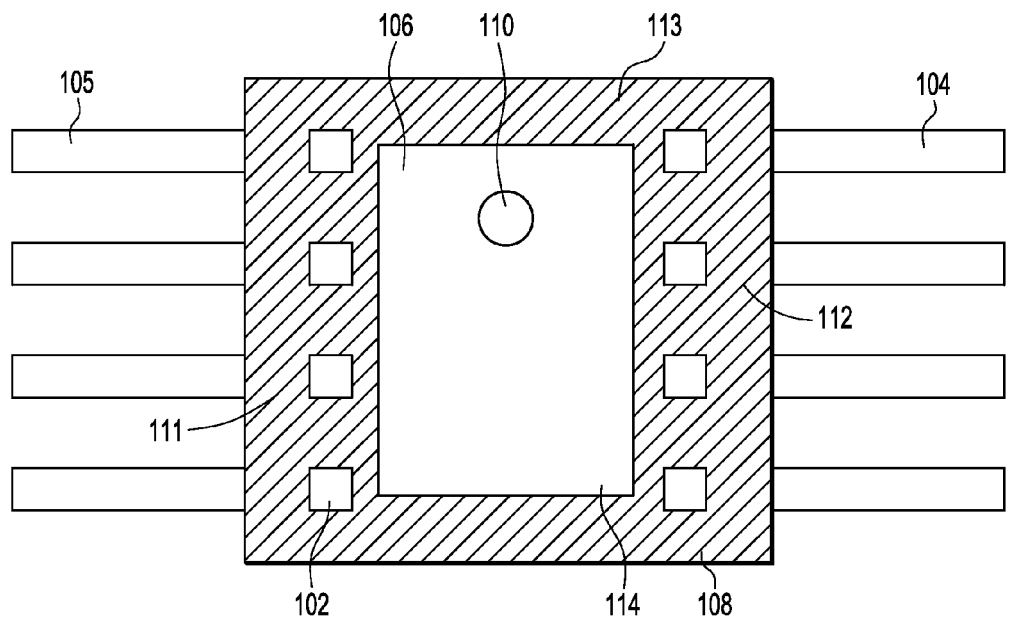
FIG. 1 is of a top view of a lead frame in accordance with one embodiment of the present disclosure.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

FIGS. 1-4 illustrate techniques for forming an integrated circuit package including an electronic sensor protected by a lid structure. The electronic sensor includes a transducer placed on a backside surface of a lead frame assembly. The lid structure is placed over the transducer and is attached to the lead frame assembly on the backside surface. The lid can define an air cavity around the transducer, such that mold compound, gel, or other protective chemical material is not placed in contact with the transducer. The transducer is therefore protected without a chemical protectant, lowering the cost of the integrated circuit package and maintaining the sensitivity and performance of the transducer.

In one embodiment, the lid is employed to protect a pressure sensor, such as a piezo-resistive transducer, while maintaining sensor accuracy. The lead frame is created such that there is a hole or opening at an exposed flag of the lead frame. The pressure sensor is placed under the opening at the backside of the lead frame, such that the opening provides a pressure vent for the pressure sensor. The lid is placed over the sensor, on the backside of the lead frame, such that the lid covers the sensor on the opposite side of the hole. The lid structure thereby protects the pressure sensor components, while allowing air to vent through the hole so that the sensor can read the ambient pressure.

The protection provided by the lid allows the pressure sensor to be used in a hostile environment, such as an automobile tire. The tire, and therefore the pressure sensor, can be subject to a variety of harsh environmental conditions, including chemicals such as lubricants, cleaners, and other contaminants. By placing a lid over the sensor, the pressure sensor is protected without employing the gel and molding compound for protection. The cost of the integrated circuit package is thereby reduced relative to packages that use chemical protectants and the performance of the sensor is maintained.

Before addressing details of embodiments described below, some terms are defined or clarified. Features within a particular region or area of interest may have dimensions expressed in terms of lengths, widths, and thicknesses (for layers and interconnects) or depths (for openings and cavities). Within the particular region or area of interest, length and width are seen from a top view, and the length is greater than the width. For a square or other similar geometric shape, the dimension from a top view is characterized by a width, and for a circle, the diameter is characterized as a width. For an oval, ellipsoid, or other similar geometric shape, a line segment corresponding to a main axis is characterized as a length, and another line segment corresponding to the minor axis is characterized as a width. The thickness of a layer or the depth of an opening can be seen from a cross-sectional view. The thickness or depth extends in a direction substantially perpendicular to the length and the width.

FIG. 1 includes an illustration of a top view of a lead frame 102. The lead frame 102 is part of a lead frame assembly that has a generally rectangular configuration, defining an opposed pair of longitudinal edges 111 and 112 and an opposed pair of lateral edges 113 and 114. The lead frame 102 also includes leads, such as lead 104 and lead 105, protruding from longitudinal edges 111 and 112. The leads are sized and arranged to collectively define a generally rectangular region disposed in the approximate center between the longitudinal edges 111 and 112. The leads on each side of the lead frame 102 extend in spaced relation to each other, with gaps defined therebetween.

In an embodiment, lead frame 102 is manufactured from a conductive metal material, such as copper, through a chemical etching process, mechanical stamping process, and the like. In the case of a chemical etching process, a pattern is etched into the metal of the lead frame 102 using photolithography and metal dissolving chemicals. In particular, a photoresist is exposed to ultraviolet light passed through a photomask having a desired pattern. The photoresist is developed and cured, and chemicals are sprayed or otherwise applied to the masked metal, and exposed portions are etched away, leaving the desired pattern. In the case of mechanical stamping, a set of progressive dies are employed to mechanically remove metal in order to achieve the desired pattern.

Subsequent to the creation of the pattern, a molding operation is applied to fill the spaces or gaps between the leads. The molding operation forms molding compound layer 108. In an embodiment, the molding compound layer 108 can be formed provide an interlock with the leads of the lead frame 102, assisting in the prevention of dislodgement or separation of the layer 108 from the frame. In an embodiment, the molding compound 108 is a composite material including epoxy resins, phenolic hardeners, polyphenylene sulfide, silicas, catalysts, pigments, and mold release agents. The molding compound layer 108 and lead frame 102 together form a lead frame assembly.

In an embodiment, the molding compound 108 is molded to be substantially flat along a major surface defined by edges 111-114, referred to as the backside surface of the lead frame assembly. In an embodiment, the molding compound 108 is molded to be substantially flat by forming the molding compound such that it has the same thickness as the lead frame 102. For example, if the lead frame 102 is 8 mil thick, the molding compound 108 can be molded such that it is also 8 mil thick. The backside surface thus defines a generally planar surface that provides structural support to hold the leads of the lead frame 102 in place. In addition, the flatness of the surface can provide for easier and more stable attachment of a lid structure, as described further herein.

The molding compound 108 is placed to define an exposed flag 106. In an embodiment, the exposed flag 106 has sufficient space for both a transducer and an integrated circuit device to be connected to the transducer. In addition, the lead frame 102 is formed to have an opening 110 from the backside surface to the opposite major surface, referred to as the frontside surface. The opening 110 allows a pressure sensor oriented over the opening to vent pressure. This can be better understood with reference to FIG. 2.

Figure 2:
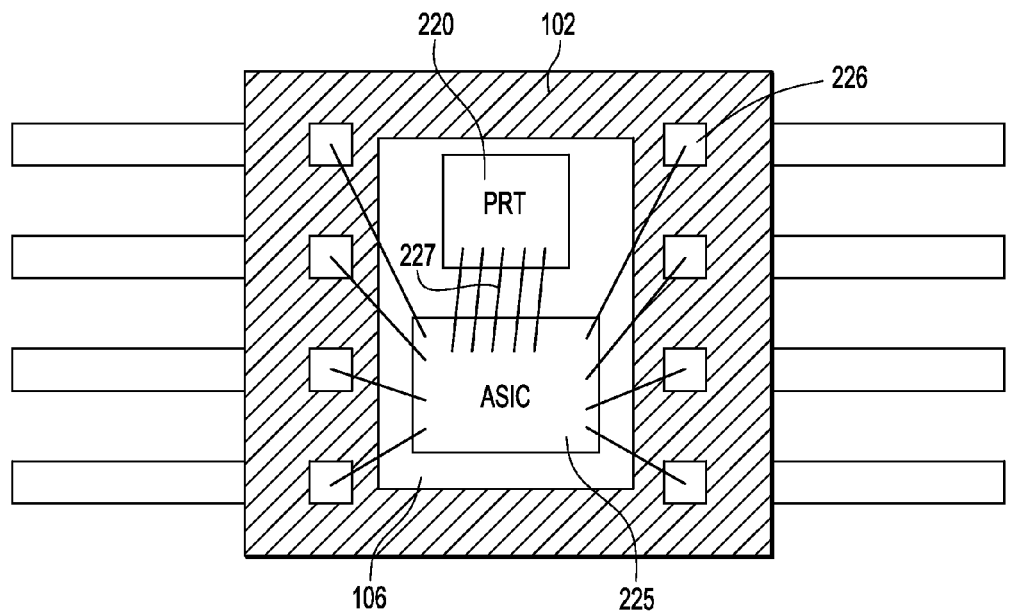
FIG. 2 is a top view of the lead frame of FIG. 1 after placement of a die and wirebonds on the lead frame in accordance with one embodiment of the present disclosure.

FIG. 2. Illustrates a top view of the lead frame assembly of FIG. 1 after placement of a semiconductor die including a transducer 220 and an integrated circuit device 227. In the illustrated embodiment, the transducer 220 and integrated circuit device 227 have been placed in the semiconductor die region 110 and bonded to the backside of the lead frame assembly with a chemical adhesive.

The transducer 220 and integrated circuit device 225 each include bond pads (not shown) electrically connected to inputs and outputs of the respective device. After placement of the transducer 220 and the integrated circuit device 225 at the exposed flag 106, wires are bonded between selected bond pads according to an integrated circuit design, forming wire bonds such as wire bond 227. In addition, wire bonds are formed between selected bond pads of the integrated circuit device 225 and selected leads of the lead frame 102. The wire bonds thereby provide electrical connections between selected inputs and outputs of the transducer 220 and selected inputs and outputs integrated circuit device 225, and between selected inputs and outputs of the integrated circuit device 225 and the leads of lead frame 102.

For purposes of discussion, it is assumed that the transducer 220 is a pressure sensor, such as a piezoresistive transducer (PRT). In other embodiments, the transducer 220 can be a temperature transducer or other type of transducer. In the illustrated embodiment, the transducer 220 has been placed and bonded such that it lies over the opening 110. This allows the transducer 220 to vent the ambient air and thereby sense ambient pressure. The transducer 220 provides electrical signaling indicative of the measured pressure to the integrated circuit device 225.

The integrated circuit device 225 determines a digital value indicative of the measured pressure based on the signaling provided by transducer 220. In an embodiment, the integrated circuit device 225 can periodically sample the signaling and convert each sample to a digital value. The integrated circuit device 225 can communicate the digital values to an external device, such as a data processing device, via the leads of the lead frame 102.

Figure 3:
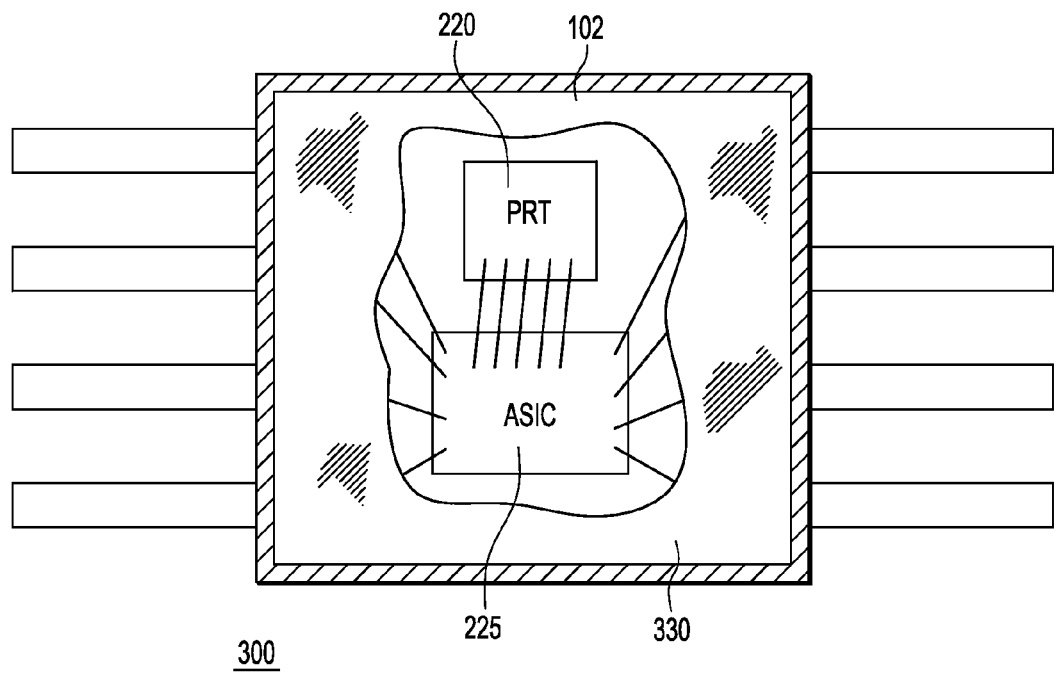
FIG. 3 a top view of the lead frame of FIG. 1 after placement of a lid over the die of FIG. 2 in accordance with one embodiment of the present disclosure.

FIG. 3 illustrates an integrated circuit package 300 including the lead frame assembly of FIG. 1, transducer 220, and integrated circuit device 225 in accordance with one embodiment of the present disclosure. The package 300 also includes a lid structure 330 placed over the transducer 220 and bonded to the backside of the lead frame 102. The lid structure 330 can be formed of stainless steel, copper, or other metal, formed of plastic, and the like. The lid structure 330 forms a protective barrier over the transducer 220 without the use of protective gel and molding compound. This can be better understood with reference to FIG. 4.

Figure 4:
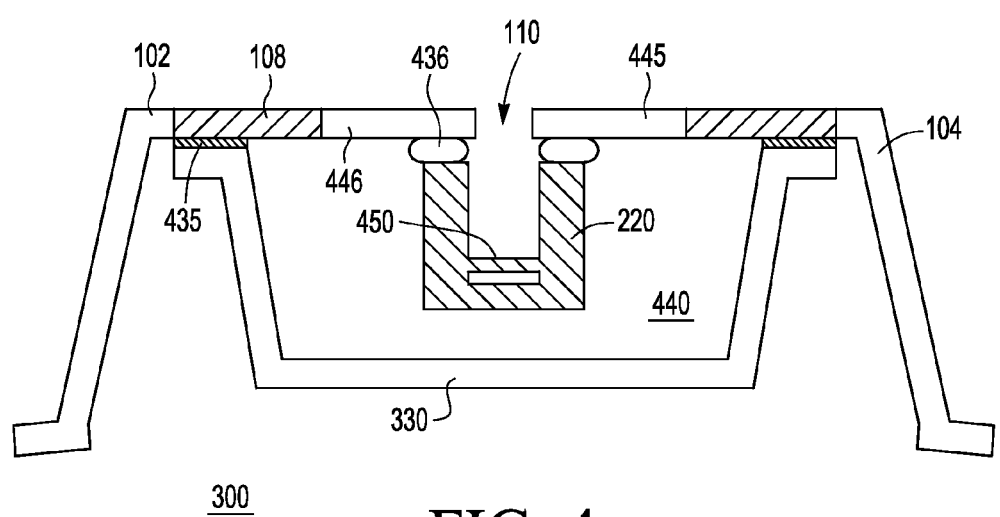
FIG. 4 is a cross-sectional view of the integrated circuit package of FIG. 3 in accordance with one embodiment of the present disclosure.

FIG. 4 illustrates a side view of the integrated circuit package 300 in accordance with one embodiment of the present disclosure. The integrated circuit package 300 includes a lead frame assembly having a lead frame 102, leads such as lead 104, transducer 220, and lid structure 330. The lead frame assembly includes a frontside 445 and a backside 446. The lead frame assembly also includes an opening 110 that passes from the frontside 445 to the backside 446.

The transducer 220 includes a sensing element 450 that interacts with the environment to sense pressure. In the illustrated embodiment, the transducer 450 has been bonded, with adhesive 436, to the backside 446 so that the sensing element 450 is placed over the opening 110. This allows air to reach the sensing element 220 so that the ambient pressure can be sensed, while allowing the other portions of the transducer 220 to remain protected by the lead frame 102 and the lid 330.

The lid 330 is bonded with an adhesive 435 to the lead frame assembly. The lid 330 is placed so that it lies over the transducer 220, and protects all sides of the transducer other than the sensing element 220 and the face bonded to the lead frame 102. A cavity 440 is defined by the internal surface of the lid 330, the portion of the backside 446 that lies under the lid 330, and the external surfaces of the transducer 220 that are opposite of the sensing element 450. In an embodiment, the cavity 440 is filled with air. Accordingly, the transducer 220 is not covered by a gel or other protective chemical, thereby reducing the cost of the device.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

As used herein, the terms "comprises," "comprising," "includes," "including," "has," "having" or any other variation thereof, are intended to cover a non-exclusive inclusion. Further, unless expressly stated to the contrary, "or" refers to an inclusive or and not to an exclusive or. Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

To the extent not described herein, many details regarding specific materials, processing acts, and circuits are conventional and may be found in textbooks and other sources within the semiconductor and microelectronic arts.

What claimed is:

1. An electronic device comprising:
   a lead frame assembly including a lead frame, the lead frame assembly having a horizontal plane defined by a first major surface, and a second major surface opposite the first major surface;
   an opening between the first major surface and the second major surface;
   a transducer attached to the first major surface over the opening;
   a lid structure attached to the first major surface to cover the transducer; and
   leads of the lead frame, non-horizontal surfaces of the leads extend in a direction away from the first major surface and opposite to the second major surface and in a same direction as non-horizontal surfaces of the transducer and non-horizontal surfaces of the lid structure extend away from the first major surface and the second major surface.

2. The electronic device of claim 1, wherein the transducer comprises a pressure sensor.

3. The electronic device of claim 2, wherein the opening provides a pressure vent for the pressure sensor.

4. The electronic device of claim 1, wherein the lid structure defines a cavity between the transducer and a bottom surface of the lid structure.

5. The electronic device of claim 1, wherein the lid structure is composed of copper.

6. The electronic device of claim 1, wherein the lid structure is composed of stainless steel.

7. The electronic device of claim 1, wherein the lid structure is composed of plastic.

8. The electronic device of claim 1, wherein the lead frame assembly further comprises:
   a plurality of leads of the lead frame; and
   a molding compound structure attached to a portion of the lead frame, the molding compound structure located between gaps of the leads to provide an interlock with the leads, and the molding compound structure defines an exposed flag of the lead frame.

9. The electronic device of claim 8, wherein the molding compound structure has a similar thickness as the lead frame between the first major surface and the second major surface, wherein the molding compound structure and lead frame together form a substantially coplanar flat surface along the first major surface based on the similar thickness between the molding compound structure and the lead frame.

10. The electronic device of claim 1, wherein the transducer is a piezoresistive transducer (PRT).

11. A method of forming an electronic device, comprising:
    providing a lead frame assembly including a lead frame, the lead frame assembly having a horizontal plane defined by a first major surface, and a second major surface opposite the first major surface, the lead frame having an opening between the first major surface and the second major surface, and leads, non-horizontal surfaces of the leads extend in a direction away from the first major surface and opposite to the second major surface and in a same direction as non-horizontal surfaces of a transducer and non-horizontal surfaces of a lid structure extend away from the first major surface and the second major surface;
    attaching the transducer to the first major surface over the opening; and
    attaching the lid structure to the first major surface to cover the transducer.

12. The method of claim 11, wherein the transducer comprises a pressure sensor.

13. The method of claim 12, wherein the opening provides a pressure vent for the pressure sensor.

14. The method of claim 11, wherein the lid structure defines a cavity between the transducer and a bottom surface of the lid.

15. The method of claim 11, wherein the lid structure is composed of copper.

16. The method of claim 11, wherein the lid structure is composed of stainless steel.

17. The method of claim 11, further comprising applying a mold compound to the lead frame prior to attaching the lid structure.

18. The method of claim 11, wherein the mold compound and the lead frame form the first a surface so that the first surface is substantially flat.

19. The method claim 11, wherein the transducer is a piezoresistive transducer (PRT).

20. An electronic device comprising:
    a lead frame assembly including a lead frame, the lead frame assembly having a horizontal plane defined by a first major surface, and a second major surface opposite the first major surface, wherein the lead frame assembly includes:
      a plurality of leads; and
      a molding compound structure attached to a portion of the lead frame, the molding compound structure located between gaps of the leads to provide an interlock with the leads, and the molding compound structure defines an exposed flag of the lead frame, wherein the molding compound structure has a similar thickness as the lead frame, wherein the molding compound structure and lead frame form a substantially coplanar flat surface along the first and second major surfaces based on the similar thickness between the molding compound structure and the lead frame;
    an opening between the first major surface and the second major surface;
    a transducer attached to the first major surface over the opening; and
    a lid structure attached to the first major surface to cover the transducer, wherein non-horizontal surfaces of the leads extend in a direction away from the first major surface and opposite to the second major surface and in a same direction as non-horizontal surfaces of the transducer and non-horizontal surfaces of the lid structure extend away from the first major surface and the second major surface.

* * * * *